US010446238B2

(12) United States Patent
    Madraswala et al.

(10) Patent No.: US 10,446,238 B2
(45) Date of Patent: Oct. 15, 2019

(54) PSEUDO SINGLE PASS NAND MEMORY PROGRAMMING

(71) Applicant: Intel Corporation, Santa Clara, CA (US)

(72) Inventors: Aliasgar S. Madraswala, Folsom, CA (US); Xin Guo, San Jose, CA (US); David B. Carlton, Pleasanton, CA (US); Purval S. Sule, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 15/717,835

(22) Filed: Sep. 27, 2017

(65) Prior Publication Data

US 2019/0096490 A1    Mar. 28, 2019

(51) Int. Cl.
    *G11C 16/04*    (2006.01)
    *G11C 16/26*    (2006.01)
    *G11C 16/10*    (2006.01)

(52) U.S. Cl.
    CPC ............. *G11C 16/26* (2013.01); *G11C 16/10* (2013.01); *G11C 16/0408* (2013.01)

(58) Field of Classification Search
    CPC ...... G11C 16/26; G11C 16/10; G11C 16/0408
    USPC .................................................. 365/185.17
    See application file for complete search history.

(56) References Cited

U.S. PATENT DOCUMENTS

| 2013/0173847 | A1* | 7/2013  | Sprouse  | G11C 7/1012  |
|              |     |         |          | 711/103      |
| 2014/0297921 | A1* | 10/2014 | Chang    | G06F 12/0246 |
|              |     |         |          | 711/103      |
| 2016/0162215 | A1* | 6/2016  | Jayaraman| G06F 3/0659  |
|              |     |         |          | 711/103      |
| 2016/0358663 | A1* | 12/2016 | Li       | G11C 16/3431 |
| 2017/0371565 | A1* | 12/2017 | Liu      | G06F 3/0613  |

* cited by examiner

*Primary Examiner* — Vu A Le
(74) *Attorney, Agent, or Firm* — Schwabe, Williamson & Wyatt, P.C.

(57) ABSTRACT

Embodiments include apparatuses, methods, and computer devices including a multi-level NAND memory array and a memory controller coupled to the multi-level NAND memory array. The multi-level NAND memory array may include a first word line and a second word line. The memory controller may receive a first page of data and a second page of data together with a program command to program the first page of data and the second page of data into the multi-level NAND memory array. The memory controller may program the first page of data into a page of the first word line via a first pass, and further program the second page of data into a page of the second word line via a second pass, subsequent to the first pass. Other embodiments may also be described and claimed.

25 Claims, 7 Drawing Sheets

PSEUDO SINGLE PASS NAND MEMORY PROGRAMMING

FIELD

Embodiments of the present disclosure relate generally to the technical field of computing, and more particularly to NAND memory programming.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Semiconductor memory may be classified as non-volatile memory or volatile memory. A non-volatile memory, e.g., NAND flash memory, may store and retain information even when the non-volatile memory is not connected to a power source. NAND flash memory, or simply NAND memory, or a NAND memory system, may be included in a storage device to store data. Bits may be stored into cells, or memory cells, of a NAND memory, which may be made of floating-gate transistors. A single level NAND memory may include single level cells (SLC) to store one bit data per cell. Alternatively, a multi-level NAND memory may include multi-level cells (MLC) or three level cells (TLC) to store multiple bits data per cell, e.g., two bits, three bits, or more. For an electronic system using a multi-level NAND memory, the time for the electronic system to program multiple bits into the multi-level NAND memory may vary greatly when programmed in multiple passes. For example, an electronic system using a TLC NAND memory may program multiple bits into the TLC NAND memory in multiple passes. Programming data into a TLC NAND memory in a first pass by an electronic system may be much faster, e.g., almost ten times faster, than programming data in the second pass by the electronic system. The time differences between programming of multiple bits in different passes by an electronic system can cause performance deviation of the electronic system using the NAND memory.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
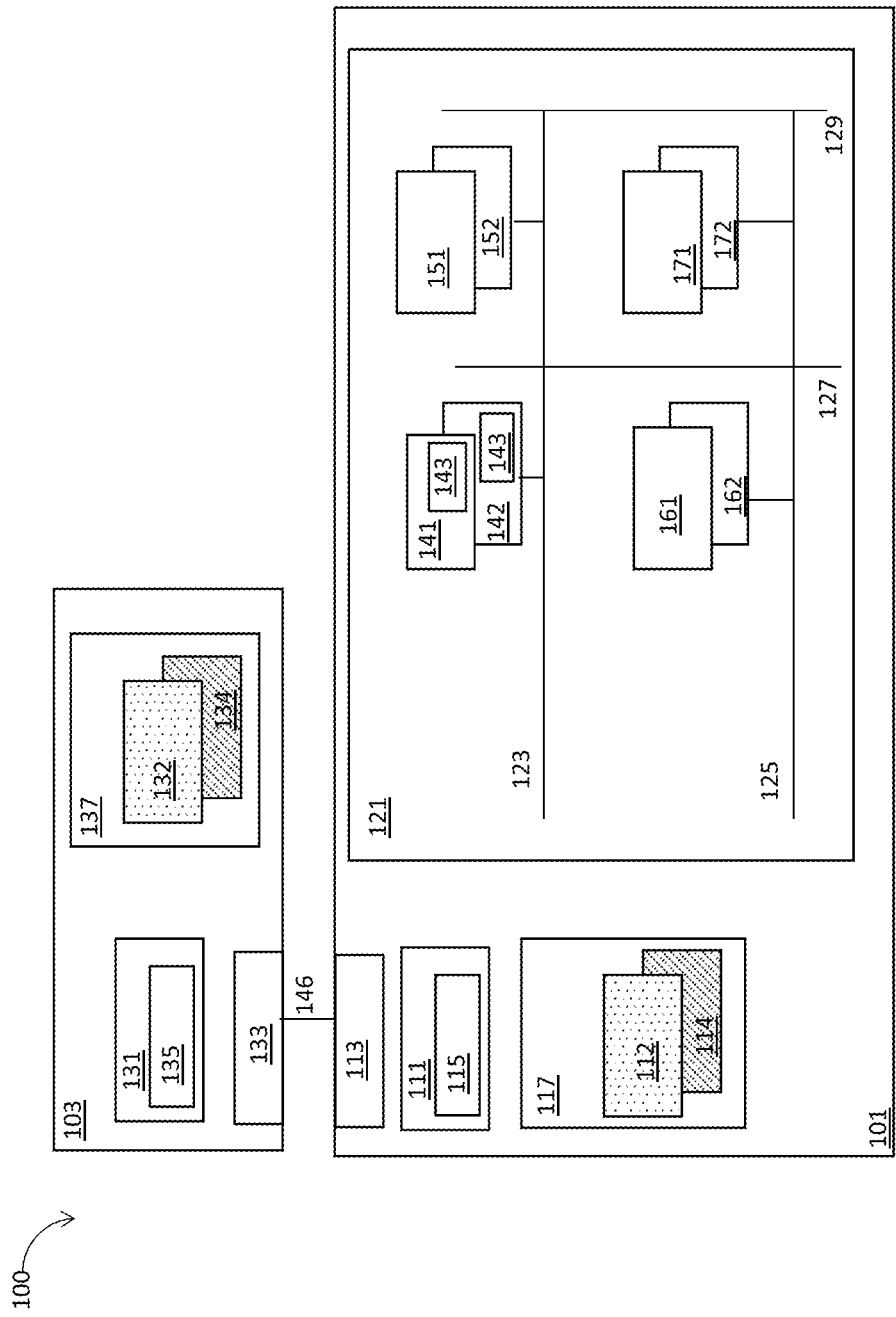
FIG. 1 illustrates an example electronic system that includes a memory controller to receive multiple pages of data together with a program command to program the multiple pages of data into a multi-level NAND memory array of a NAND memory system, in accordance with various embodiments.

A NAND memory system may include a single level or multi-level NAND memory array and a memory controller to control the operations, e.g., read, write (program), erase, of the multi-level NAND memory array. A multi-level NAND memory array may include multiple cells organized into pages, blocks, planes on a die, while the multi-level NAND memory array may include multiple dies. The smallest unit of operations for a multi-level NAND memory array is referred to as a page. A page of data is programmed into or read from a multi-level NAND memory array.

A NAND memory system may be a storage device coupled to an external computing device to store data generated by the computing device. Additionally and alternatively, a NAND memory system may be a part of a computing system to store data generated by a processor of the computing system. Sometimes, data are programmed into the multi-level NAND memory array by the computing system or the computing device in two or more passes, to minimize the effect of coupling from the neighboring cells. However, the time differences between programming multiple bits in different passes by the computing system or the computing device may cause performance deviation of the computing system or the computing device using the NAND memory.

Embodiments herein may facilitate a pseudo single pass programming for a computing system or a computing device using a NAND memory system where multiple pages of data may be perceived to be programmed at a same pass by the computing system or the computing device. The computing system or the computing device may provide multiple pages of data at once at a same pass to a NAND memory system. Internally within the NAND memory system, a memory controller may program the multiple pages of data into a multi-level NAND memory array in multiple passes. Hence, embodiments herein may achieve the benefits of single pass programming at the system level for the computing system or the computing device, while maintaining the benefits of multiple pass programming for the NAND memory array.

In embodiments, an apparatus for computing may include a multi-level NAND memory array and a memory controller coupled to the multi-level NAND memory array. The multi-level NAND memory array may include a first word line and a second word line. The memory controller may receive a first page of data and a second page of data together with a program command to program the first page of data and the second page of data into the multi-level NAND memory array. The memory controller may program the first page of data into a page of the first word line via a first pass, and further program the second page of data into a page of the second word line via a second pass, subsequent to the first pass.

In embodiments, an electronic system may include a host controller, and a NAND memory system coupled to the host controller. The host controller may generate a first page of data, a second page of data, and a program command to program the first page of data and the second page of data into a multi-level NAND memory array within the NAND memory system. The NAND memory system may include the multi-level NAND memory array and a memory controller coupled to the host controller and the multi-level NAND memory array. The multi-level NAND memory array may include a first word line and a second word line. The memory controller may receive the first page of data, the second page of data, together with the program command from the host controller. The memory controller may program the first page of data into a page of the first word line via a first pass, and program the second page of data into a page of the second word line via a second pass, subsequent to the first pass.

In embodiments, one or more non-transitory computer-readable media may include instructions that cause a memory controller, in response to execution of the instructions by the memory controller, to operate the memory controller to receive a first page of data, a second page of data, together with a program command to program the first page of data and the second page of data into a multi-level NAND memory array coupled to the memory controller. The multi-level NAND memory array may include a first word line and a second word line. The memory controller may be further caused to program the first page of data into a page of a first word line of the multi-level NAND memory array via a first pass, and program the second page of data into a page of a second word line of the multi-level NAND memory array via a second pass subsequent to the first pass.

In the description to follow, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" or "routine" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIG. 1 illustrates an example electronic system 100 that includes a memory controller 111 to receive multiple pages of data, e.g., a page of data 132, and a page of data 134, together with a program command 135 to program the multiple pages of data into a multi-level NAND memory array 121 of a NAND memory system 101, in accordance with various embodiments. For clarity, features of the electronic system 100 may be described below as an example for understanding an example electronic system that may include a memory controller to receive multiple pages of data together with a program command to program the multiple pages of data into a multi-level NAND memory array of a NAND memory system. It is to be understood that there may be more or fewer components included in the electronic system 100. Further, it is to be understood that one or more of the devices and components within the electronic system 100 may include additional and/or varying features from the description below, and may include any device that one having ordinary skill in the art would consider and/or refer to as an electronic system.

In embodiments, the electronic system 100 may include the NAND memory system 101 coupled to a host 103 by an interconnect 146 through an interface 133 on the host 103 and an interface 113 on the NAND memory system 101. The host 103 may include a host controller 131, where the host controller 131 may generate the page of data 132, the page of data 134, and the program command 135 to program the page of data 132 and the page of data 134 into the multi-level NAND memory array 121 within the NAND memory system 101. The page of data 132 and the page of data 134 may be stored in a buffer 137.

In embodiments, the NAND memory system 101 may include the multi-level NAND memory array 121, the memory controller 111, a buffer 117, and the interface 113, coupled with each other. The memory controller 111 may receive the page of data 132 and store the received page of data as a page of data 112 in the buffer 117, and may receive the page of data 134 and store the received page of data as a page of data 114 in the buffer 117. The memory controller 111 may receive the program command 135 and store the received program command 135 as a program command 115. The page of data 132, the page of data 134, and the program command 135 may be received at the same time from the host 103. Accordingly, for the host 103, the page of data 132 and the page of data 134 may be programmed in a single pass, at a same time, so that there is reduced time difference compared to programming the page of data 132 and programming the page of data 134 separately in two passes by the host controller 131.

The multi-level NAND memory array 121 may be formed by multiple cells arranged in an array. The multi-level NAND memory array 121 may include a word line 123, a word line 125, a bit line 127, and a bit line 129. In some embodiments, the bit line 127 and the bit line 129 may represent multiple bit lines. There may be multiple pages, e.g., a page 141 and a page 142 associated with the word line 123 and the bit line 127, including cells formed by the word line 123 and the bit line 127. Similarly, a page 151 and a page 152 may be associated with the word line 123 and a bit line 129, a page 161 and a page 162 may be associated with a word line 125 and the bit line 127, and a page 171 and a page 172 may be associated with the word line 125 and the bit line 129.

Figure 2:
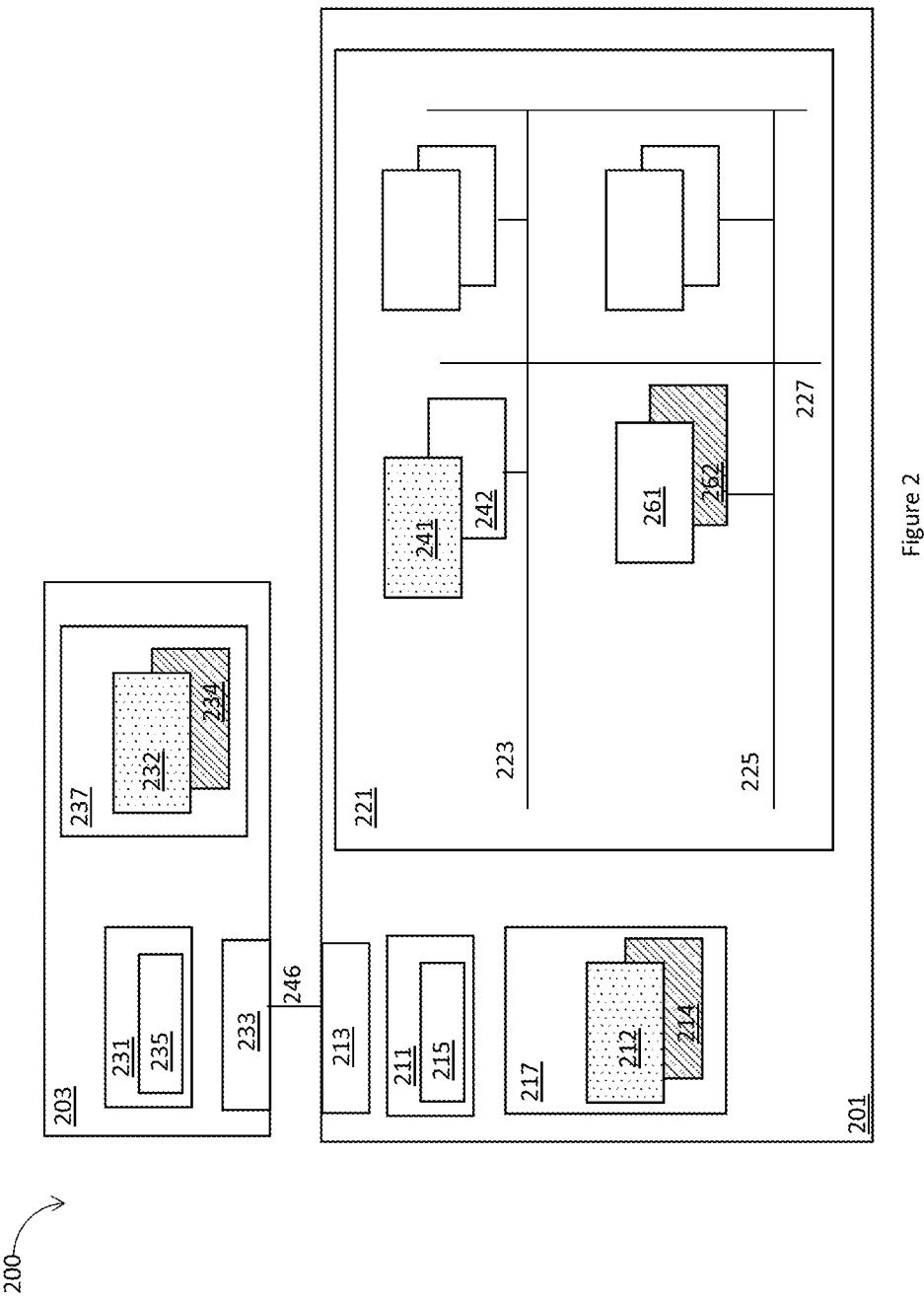
FIG. 2 illustrates another example electronic system that includes a memory controller to receive multiple pages of data together with a program command to program the multiple pages of data into a multi-level NAND memory array of a NAND memory system, in accordance with various embodiments.

The page 141 and the page 142 may be represented by a same group of cells associated with the same word line, e.g., the word line 123. For example, a cell 143 may store multiple bits, e.g. two bits. The first bit of the cell 143 may be contained in the page 141, while the second bit of the cell 143 may be contained in the page 142. In some embodiments, all the cells belonging to one word line may be included into one page, so that the page 141 may expand throughout the word line 123. In some other embodiments, cells associated with one word line may be divided into multiple pages, e.g., cells of the word line 123 may be included in the page 141 and the page 151 separately. The memory controller 111 may program the page of data 112 and the page of data 114 in multiple passes into pages of the multi-level NAND memory array 121, as shown in FIG. 2.

In embodiments, the electronic system 100 may be a system on chip (SOC), integrating the host 103 and the NAND memory system 101, together with other components, e.g., cache, random access memory (RAM), peripheral functions, or other functions onto one chip. The NAND memory system 101 may be a storage device, and the host 103 may be an external computing device coupled to the NAND memory system 101. Alternatively, the electronic system 100 may be a computing system, the host controller 131 may be a processor of the computing system, coupled to the memory controller 111 with or without the interface 113 and the interface 133. The electronic system 100 may be for various applications such as wireless communication, digital signal processing, security, and other applications.

In embodiments, the host 103 may be a computing system, a storage system, or any other system that may program multiple pages of data into a multi-level NAND memory array. In some examples, the host 103 may be implemented by a personal computer (e.g., a desktop computer, a laptop computer, etc.). However, the host 103 may be implemented by any other hardware and/or software. For example, the host 103 may be a smartphone, a television, a set top box, a printer, a home automation system, etc. In embodiments, the host 103 may be any type of computing system capable of programming data into the NAND memory system 101. In some other embodiments, the host 103 may be a storage system, e.g., a solid-state drive (SSD) system, while the host controller 131 may be a SSD controller. When the host 103 is a SSD system, the host 103 may be coupled to another computing system, where data, e.g., the page of data 132, and the page of data 134, may be generated by another computing system or by the host 103.

In embodiments, the host 103 may include the interface 133 that communicates with the interface 113 of the NAND memory system 101 using the interconnect 146. In embodiments, the interface 113 of the NAND memory system 101 may receive the page of data 132 and the page of data 134 to be stored in the buffer 117. In embodiments, any other type of communication interconnect or link may additionally or alternatively be used for the interconnect 146, the interface 133, and the interface 113, such as, for example, a Parallel Advanced Technology Attachment (PATA) interconnect developed by the American National Standards Institute (ANSI) as standard no. X3.221-1994, a Serial Advanced Technology Attachment (SATA) interconnect developed by the Serial ATA International Organization, a Small Computer System Interface (SCSI) interconnect, a Serial-Attached SCSI (SAS) interconnect developed by the T10 group as standards document InterNational Committee for Information Technology Standards (INCITS), Peripheral Component Interconnect (PCI) express (PCIe) interconnect developed by the PCI Special Interests Group (PCI-SIG) as the PCI Express Base Specification, or a Non-Volatile Memory (NVMe) interconnect, etc.

In embodiments, the memory controller 111 or the host controller 131 may be implemented by a hardware processor, e.g., a silicon based processor, such as a microcontroller, a 16-bit processor, a 32-bit processor, a 64-bit processor, a single core processor, a multi-core processor, a digital signal processor, an embedded processor, or any other processor. In addition, any other type of circuitry may additionally or alternatively be used such as, for example an analog or digital circuit(s), a logic circuit, a programmable processor(s), an application specific integrated circuit(s) (ASIC(s)), a programmable logic device(s) (PLD(s)) and/or field programmable logic device(s) (FPLD(s)). The memory controller 111 may receive the program command 135, the page of data 132, and the page of data 134, at a same time in a single pass. In addition, the memory controller 111 may program the received multiple pages of data, e.g., the page of data 112 and the page of data 114, into the multi-level NAND memory array 121 in multiple passes.

In embodiments, the buffer 117 and/or the buffer 137 may store a page of data. For example, the buffer 137 may store the page of data 132 and the page of data 134. The page of data 132 and the page of data 134 may be generated by the host controller 131 at different times. However, they are stored in the buffer 137 to be accumulated and to be programmed together by the single program command 135. In some embodiments, the buffer 117 and/or the buffer 137 may be implemented as an application specific integrated circuit (ASIC). However, any other approach to implementing a buffer may additionally or alternatively be used. For example, the buffer 117 and/or the buffer 137 may be implemented in a memory die.

FIG. 2 illustrates another example electronic system 200 that includes a memory controller 211 to receive multiple pages of data, e.g., a page of data 232, and a page of data 234, together with a program command 235 to program the multiple pages of data into a multi-level NAND memory array 221 of a NAND memory system 201, in accordance with various embodiments. The electronic system 200 may be similar to the electronic system 100, the memory controller 211 may be similar to the memory controller 111, the multi-level NAND memory array 221 may be similar to the multi-level NAND memory array 121, and the NAND memory system 201 may be similar to the NAND memory system 101, as shown in FIG. 1.

In embodiments, the electronic system 200 may include the NAND memory system 201 coupled to a host 203 by an interconnect 246 through an interface 233 on the host 203 and an interface 213 on the NAND memory system 201. The host 203 may include a host controller 231, where the host controller 231 may generate the page of data 232, the page of data 234, and the program command 235 to program the page of data 232 and the page of data 234 into the multi-level NAND memory array 221 within the NAND memory system 201. The page of data 232 and the page of data 234 maybe stored in a buffer 237.

In embodiments, the NAND memory system 201 may include the multi-level NAND memory array 221, the memory controller 211, a buffer 217, and the interface 213, coupled with each other. The memory controller 211 may receive the page of data 232 and store the received page of data as a page of data 212 in the buffer 217, and may receive the page of data 234 and store the received page of data as a page of data 214 in the buffer 217. The memory controller 111 may receive the program command 235 and store the received program command 235 as a program command 215. The page of data 232, the page of data 234, and the program command 235 may be received at the same time, or at a single pass, from the host 203. Accordingly, for the host 203, the page of data 232 and the page of data 234 may be programmed in a single pass, instead of programming the page of data 232 and the page of data 234 individually in multiple passes into the multi-level NAND memory array 221.

The multi-level NAND memory array 221 may include a word line 223, a word line 225, and a bit line 227. There may be multiple pages, e.g., a page 241 and a page 242 associated with the word line 223 and the bit line 227, including cells formed by the word line 223 and the bit line 227. Similarly, a page 261 and a page 262 may be associated with a word line 225 and the bit line 227. Additional pages may be formed as well.

In embodiments, the memory controller 211 may program the page of data 212 into the page 241 via a first pass. In addition, the memory controller 211 may program the page of data 214 into the page 262 via a second pass, subsequent to the first pass. Afterwards, the memory controller 211 may report a cumulative pass or failure status to the host controller 231, for the program command 235 to program the page of data 232 and the page of data 234. The page 262 may be associated with the word line 225, while the page 241 may be associated with the word line 223, different from the word line 225. Hence, the memory controller 211 may work differently from the approach where the page of data 212 and the page 214, received at the same time with the program command 235, may be programmed into pages associated with a single word line, e.g., the word line 233. By programming the page of data 212 and the page of data 214 via two passes within the multi-level NAND memory array 221, the memory controller 211 can reduce the effect of coupling from the neighboring cells for the page 241 and the page 262.

The multiple pages of data, e.g., the page of data 212 and the page of data 214 may be received from the host controller 231 together with the program command 235. For the host 203, the page of data 232 and the page of data 234 may be programmed in a single pass. Therefore, the performance of the host 103 may be improved compared to programming the page of data 232 and the page of data 234 in two different passes. On the other hand, for the memory controller 211, the page of data 212 and the page of data 214 may be programmed in multiple passes within the multi-level NAND memory array 221, hence the effect of coupling from the neighboring cells may be reduced as well.

Figure 3:
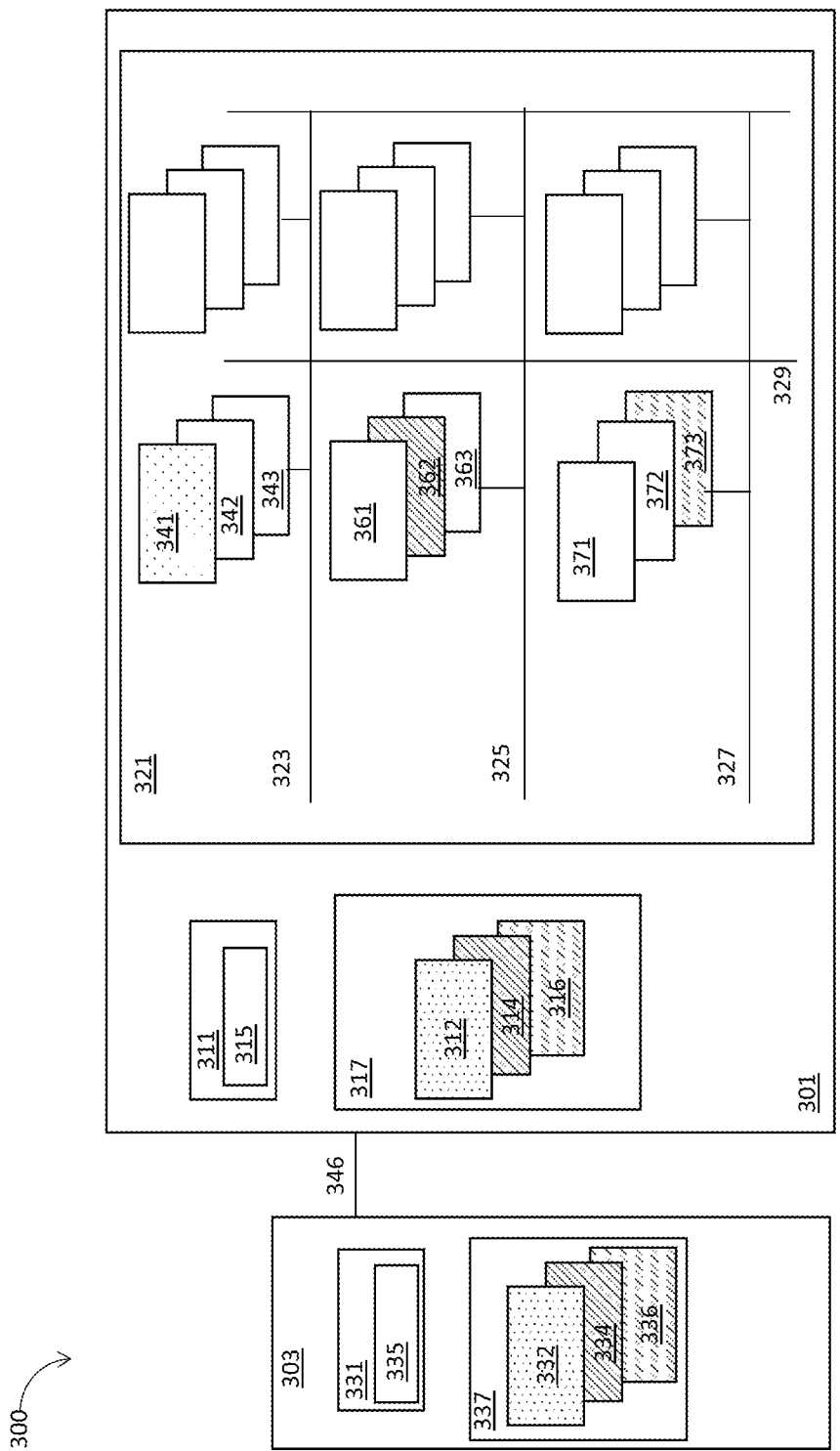
FIG. 3 illustrates another example electronic system that includes a memory controller to receive multiple pages of data together with a program command to program the multiple pages of data into a multi-level NAND memory array of a NAND memory system, in accordance with various embodiments.

FIG. 3 illustrates another example electronic system 300 that includes a memory controller 311 to receive multiple pages of data, e.g., a page of data 332, a page of data 334, a page of data 336, together with a program command, e.g., a program command 335, to program the multiple pages of data into a multi-level NAND memory array 321 of a NAND memory system 301, in accordance with various embodiments. The electronic system 300 may be similar to the electronic system 100, the memory controller 311 may be similar to the memory controller 111, the multi-level NAND memory array 321 may be similar to the multi-level NAND memory array 121, and the NAND memory system 301 may be similar to the NAND memory system 101, as shown in FIG. 1.

In embodiments, the electronic system 300 may include the NAND memory system 301 coupled to a host 303 by an interconnect 346. The host 303 may include a host controller 331, where the host controller 331 may generate the page of data 332, the page of data 334, the page of data 336, and the program command 335 to program the page of data 332, the page of data 334, and the page of data 336 into the multi-level NAND memory array 321 within the NAND memory system 301. The page of data 332, the page of data 334, and the page of data 336 maybe stored in a buffer 237.

In embodiments, the NAND memory system 301 may include the multi-level NAND memory array 321, the memory controller 311, and a buffer 317, coupled with each other. The memory controller 311 may receive the page of data 332 and store the received page of data as a page of data 312 in the buffer 317, receive the page of data 334 and store the received page of data as a page of data 314 in the buffer 317, and receive the page of data 336 and store the received page of data as a page of data 316 in the buffer 317. The memory controller 311 may receive the program command 335 and store the received program command 335 as a program command 315. The page of data 332, the page of data 334, the page of data 336, and the program command 335 may be received at the same time, or at a single pass, from the host 303. Accordingly, for the host 303, the page of data 332, the page of data 334, and the page of data 336 may be programmed in a single pass, instead of programming the page of data 332, the page of data 334, and the page of data 336 individually in multiple passes into the multi-level NAND memory array 321.

The multi-level NAND memory array 321 may include a word line 323, a word line 325, a word line 327, and a bit line 329. The multi-level NAND memory array 321 may be a three level NAND memory array, where multiple of three pages are associated with a word line. For example, a page 341, a page 342, and a page 343 may be associated with the word line 323 and the bit line 329, including cells formed by the word line 323 and the bit line 329. The page 341 may be a lower page, the page 342 may be an upper page, and the page 343 may be an extra page of the word line 323. Similarly, a page 361, a page 362, and a page 363 may be associated with a word line 325 and the bit line 329. A page 371, a page 372, and a page 373 may be associated with a word line 327 and the bit line 329. Additional pages may be formed as well.

In embodiments, the memory controller 311 may program the page of data 312 into the page 341 via a first pass, where the page 341 may be a lower page. In addition, the memory controller 311 may program the page of data 314 into the page 362 via a second pass, subsequent to the first pass, where the page 362 may be an upper page. Furthermore, the memory controller 311 may program the page of data 316 into the page 373 via a third pass, where the page 373 may be an extra page. Afterwards, the memory controller 311 may report a cumulative pass or failure status to the host controller 331, for the program command 335 to program the page of data 332, the page of data 334, and the page of data 336.

The page 341 may be associated with the word line 323, the page 362 may be associated with the word line 325, and the page 373 may be associated with the word line 327, different from each other. In some other embodiments, the page of data 316 may be programmed into another page of the word line 323 or another page of word line 325. In some other embodiments, the page of data 316 and the page of data 312 may be programmed together in a same pass to the pages associated with the word line 323. For example, the page of data 312 may be programmed into the page 341, while the page of data 316 may be programmed into the page 342. Similarly, the page of data 316 and the page of data 314 may be programmed together in a same pass to the pages associated with the word line 325. For example, the page of data 314 may be programmed into the page 362, while the page of data 316 may be programmed into the page 363. In embodiments, the host controller 331 may program multiple pages of data, e.g., the page of data 332, the page of data 334, and the page of data 336, by a single program command, e.g., the program command 335. The memory controller 311 may receive the multiple pages of data, e.g., the page of data 332, the page of data 334, and the page of data 336, and may program the multiple pages of data in any possible multiple passes, e.g., two passes, or three passes. In some embodiments, the multiple pages of data may be programmed by the memory controller 311 in a way so that the multiple pages of data are programmed into pages of different word lines. In some other embodiments, the multiple pages of data may be programmed by the memory controller 311 in a way so that there may be more than one page of a word line may have the programmed page of data.

In embodiments, the multi-level NAND memory array 321 may be an n level NAND memory array, where n>3, and the multi-level NAND memory array 321 may include multiple word lines that include the word line 323 and the second word line 325. The memory controller 311 may further receive, m pages of data, n>=m>=2, that include the page of data 332 and the page of data 334 together with the program command 335 to program the m pages of data into the n level NAND memory array. The received m pages of data may be saved into the buffer 317. Afterwards, the memory controller 311 may program the m pages of data into pages of the multiple word lines, via multiple passes.

Figure 4:
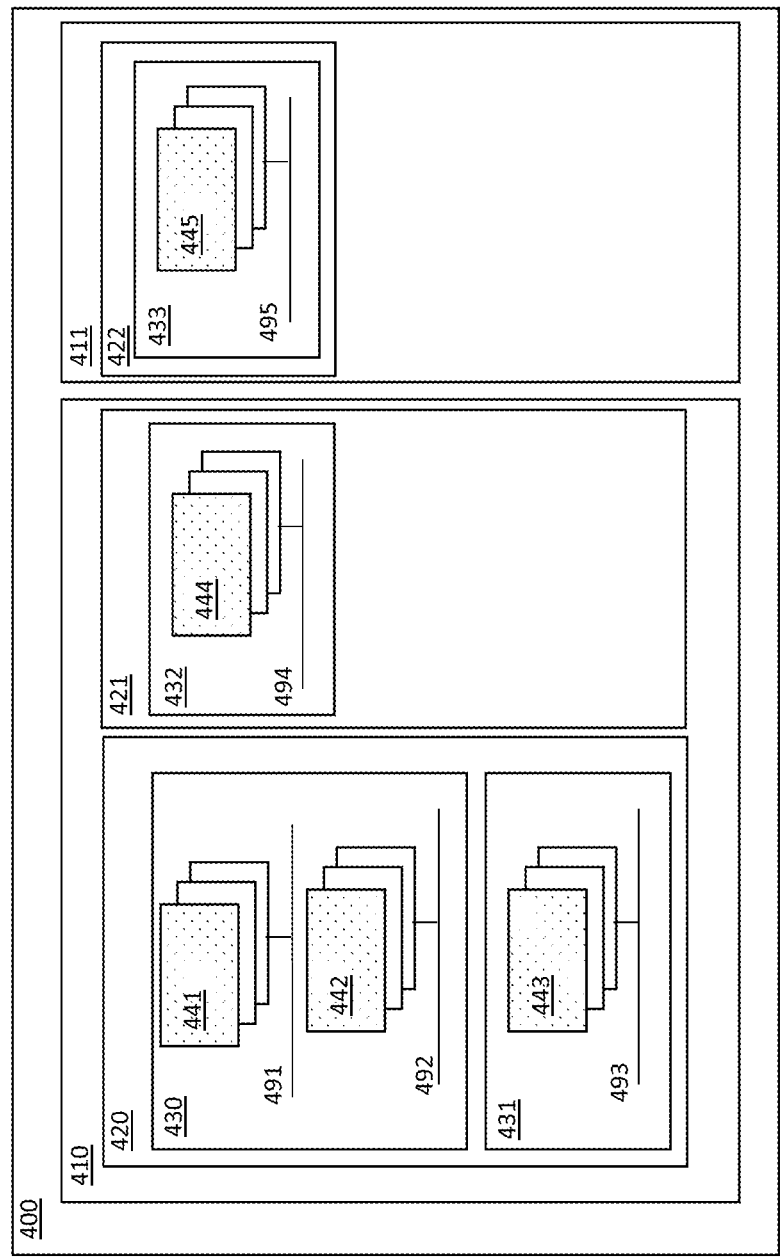
FIG. 4 illustrates an example multi-level NAND memory array including multiple pages, in accordance with various embodiments.

FIG. 4 illustrates an example multi-level NAND memory array 400 including multiple pages, e.g., a page 441, a page 442, a page 443, a page 444, a page 445, and more, in accordance with various embodiments. The page 441, the page 442, the page 443, the page 444, the page 445 may be examples of the page 141, the page 162, the page 241, the page 262, the page 341, the page 362, or other pages as shown in FIGS. 1-3. Operations performed on the page 441, the page 442, the page 443, the page 444, the page 445 may be similar to operations described in FIGS. 1-3.

In embodiments, the page 441 and the page 442 may be included in a block 430. In embodiments, the page 441 and the page 442 may be examples of the page 241 and the page 262. A first page of data, e.g., the page of data 212, may be programmed into the page 441 associated with a word line 491. A second page of data, e.g., the page of data 214, may be programmed into the page 442 associated with a word line 492.

In embodiments, the page 441 may be included in the block 430, while the page 443 may be included in a block 431, different from the block 430. In embodiments, the page 441 and the page 443 may be examples of the page 241 and the page 262. A first page of data, e.g., the page of data 212, may be programmed into the page 441 associated with the word line 491. A second page of data, e.g., the page of data 214, may be programmed into the page 443 associated with a word line 493.

In embodiments, the page 441 may be included in the block 430, while the block 430 may be included in a plane 420. A page 444 may be included in a block 432, while the block 432 may be included in a plane 421. In embodiments, the page 441 and the page 444 may be examples of the page 241 and the page 262. A first page of data, e.g., the page of data 212, may be programmed into the page 441 associated with the word line 491. A second page of data, e.g., the page of data 214, may be programmed into the page 444 associated with a word line 494.

In embodiments, the page 441 may be included in the block 430, the block 430 may be included in a plane 420, and the plane 420 may be included in a die 410. A page 445 may be included in a block 433, the block 433 may be included in a plane 422, and the plane 422 may be included in a die 411. In embodiments, the page 441 and the page 445 may be examples of the page 241 and the page 262. A first page of data, e.g., the page of data 212, may be programmed into the page 441 associated with the word line 491. A second page of data, e.g., the page of data 214, may be programmed into the page 445 associated with a word line 495.

In some embodiments, the page 441, the page 442, the page 443, the page 444, or the page 445 may have a size in a range of about 8 kB to about 16 kB. The block 430, the block 431, the block 432, and the block 433 may have a size of about 4 MB to about 100 MB.

Figure 5:
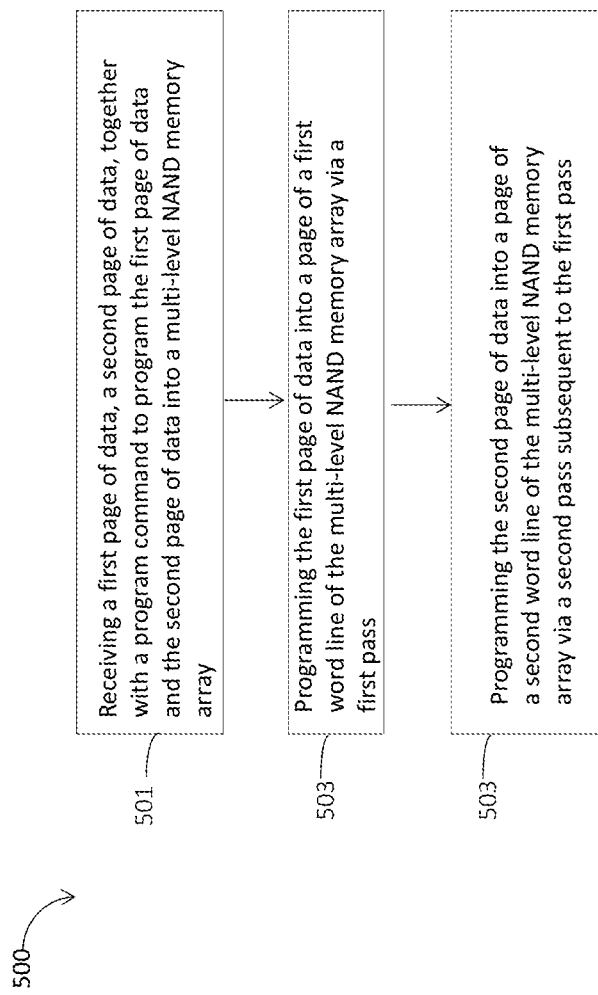
FIG. 5 illustrates an example process for a memory controller to receive multiple pages of data together with a program command to program the multiple pages of data into a multi-level NAND memory array, in accordance with various embodiments.

FIG. 5 illustrates an example process 500 for a memory controller to receive multiple pages of data together with a program command to program the multiple pages of data into a multi-level NAND memory array, in accordance with various embodiments. In embodiments, the process 500 may be a process performed by the memory controller 111 in FIG. 1, the memory controller 211 in FIG. 2, or the memory controller 311 in FIG. 3. The following descriptions are provided using the memory controller 211 as an example.

The process 500 may start at an interaction 501. During the interaction 501, the memory controller may receive a first page of data, a second page of data, together with a program command to program the first page of data and the second page of data into a multi-level NAND memory array. For example, at the interaction 501, the memory controller 211 may receive the page of data 232, the page 234, and the program command 235 to program the page of data 232 and the page of data 234 into the multi-level NAND memory array 221.

During an interaction 503, the memory controller may program the first page of data into a page of a first word line of the multi-level NAND memory array via a first pass. For example, at the interaction 503, via a first pass, the memory controller 211 may program the page of data 212, which is the stored page of data 232, into the page 241 of the word line 223 within the multi-level NAND memory array 221.

During an interaction 505, the memory controller may program the second page of data into a page of a second word line of the multi-level NAND memory array via a second pass subsequent to the first pass. For example, at the interaction 505, via a second pass subsequent to the first pass, the memory controller 211 may program the page of data 214, which is the stored page of data 234, into the page 262 of the word line 225 within the multi-level NAND memory array 221.

Figure 6:
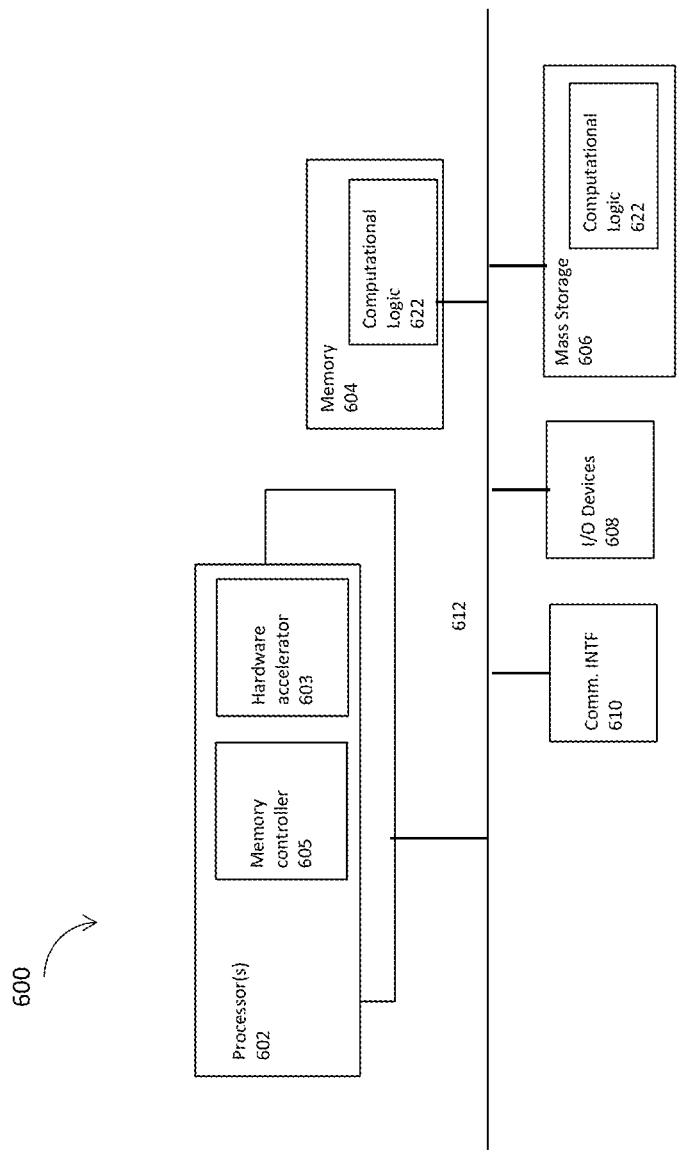
FIG. 6 illustrates an example device suitable for use to practice various aspects of the present disclosure, in accordance with various embodiments.

FIG. 6 illustrates an example communication device 600 that may be suitable as a device to practice selected aspects of the present disclosure. As shown, the device 600 may include one or more processors 602, each having one or more processor cores. One or more processor cores may include hardware accelerator 603 and a memory controller 605. The device 600 may be an example of the electronic system 100 as shown in FIG. 1, the electronic system 200 as shown in FIG. 2, or the electronic system 300 as shown in FIG. 3. The one or more processors 602 may be an example of the host controller 131 as shown in FIG. 1, the host controller 231 as shown in FIG. 2, or the host controller 331 as shown in FIG. 3. In addition, the device 600 may include a memory 604, which may be any one of a number of known persistent storage media; a mass storage 606, and one or more input/output devices 608. In embodiments, the memory 604 may be an example of the NAND memory system 101, the NAND memory system 201, or the NAND memory system 301. Furthermore, the device 600 may include a communication interface 610. The communication interface 610 may be any one of a number of known communication interfaces. The elements may be coupled to each other via system bus 612, which may represent one or more buses. In the case of multiple buses, they may be bridged by one or more bus bridges (not shown).

Each of these elements may perform its conventional functions known in the art. In particular, the system memory 604 may be employed to store a working copy and a permanent copy of the programming instructions implementing an operating system and one or more applications, collecitvely referred to as computational logic 622, and memory controller 605 may be configured to perform the operations associated with pseudo single pass programming of system memory 604, as described in connection with FIGS. 1-6. The programming instructions may be assembler instructions supported by processor(s) 602 or high-level languages, such as, for example, C, that can be compiled into such instructions.

The number, capability and/or capacity of these elements 602-622 may vary, depending on the number of other devices the device 600 is configured to support. Otherwise, the constitutions of elements 602-622 are known, and accordingly will not be further described.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module," or "system."

Figure 7:
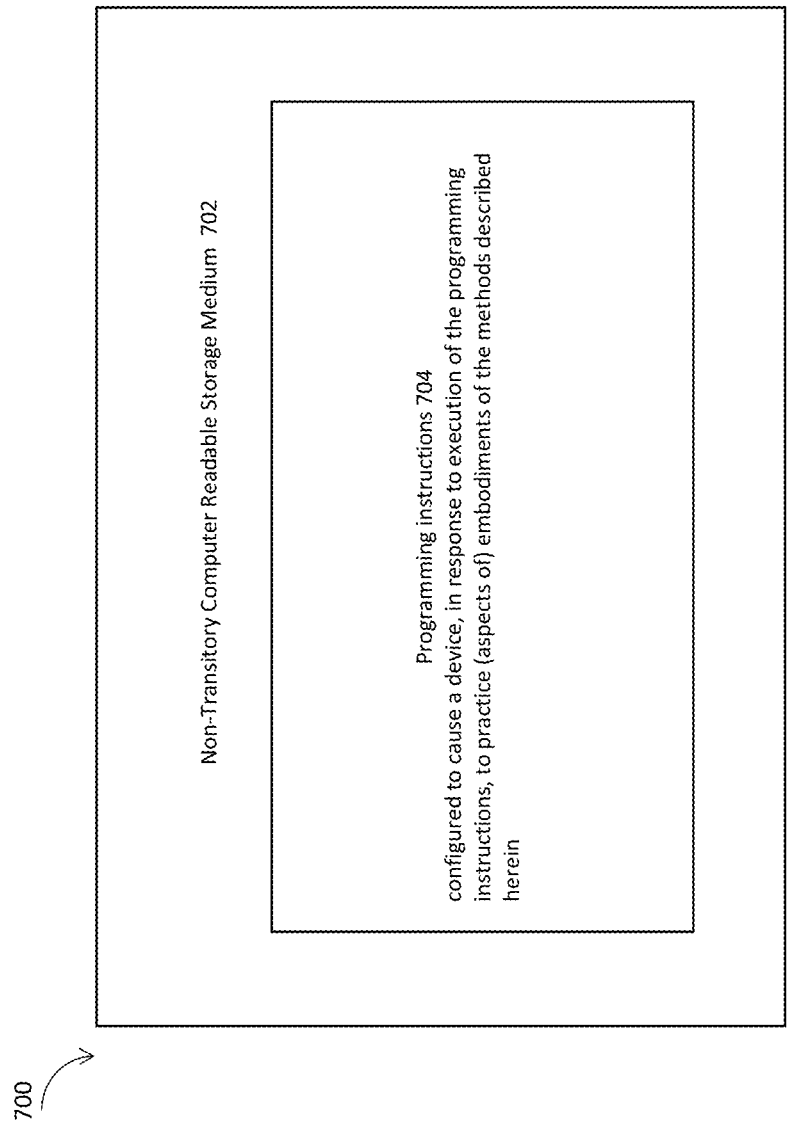
FIG. 7 illustrates a storage medium having instructions for practicing methods described with references to FIGS. 1-6, in accordance with various embodiments.

Furthermore, the present disclosure may take the form of a computer program product embodied in any tangible or non-transitory medium of expression having computer-usable program code embodied in the medium. FIG. 7 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 702 may include a number of programming instructions 704. Programming instructions 704 may be configured to enable a device, e.g., device 600, in particular, memory controller 605, in response to execution of the programming instructions, to perform, e.g., various operations associated with the memory controller 111 and the host controller 131 as shown in FIG. 1, the memory controller 211 and the host controller 231 as shown in FIG. 2, or the memory controller 311 and the host controller 331 as shown in FIG. 3.

In alternate embodiments, programming instructions 704 may be disposed on multiple computer-readable non-transitory storage media 702 instead. In alternate embodiments, programming instructions 704 may be disposed on computer-readable transitory storage media 702, such as, signals. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Embodiments may be implemented as a computer process, a computing system or as an article of manufacture such as a computer program product of computer readable media. The computer program product may be a computer storage medium readable by a computer system and encoding computer program instructions for executing a computer process.

The corresponding structures, material, acts, and equivalents of all means or steps plus function elements in the claims below are intended to include any structure, material or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiments are chosen and described in order to best explain the principles of the disclosure and the practical application, and to enable others of ordinary skill in the art to understand the disclosure for embodiments with various modifications as are suited to the particular use contemplated.

Thus various example embodiments of the present disclosure have been described including, but are not limited to:

Example 1 may include an apparatus for computing, comprising: a multi-level NAND memory array including a first word line and a second word line; a memory controller coupled to the multi-level NAND memory array, wherein the memory controller is to: receive a first page of data and a second page of data together with a program command to program the first page of data and the second page of data into the multi-level NAND memory array; program the first page of data into a page of the first word line via a first pass; and program the second page of data into a page of the second word line via a second pass, subsequent to the first pass.

Example 2 may include the apparatus of example 1 and/or some other examples herein, wherein the multi-level NAND memory array is a three or higher level NAND memory array, the multi-level NAND memory array further includes a third word line, and the memory controller is further to: receive, a third page of data together with the first page of data, the second page of data, and the program command to program the first page of data, the second page of data, and the third page of data into the multi-level NAND memory array; and program the third page of data into a page of the third word line via a third pass.

Example 3 may include the apparatus of example 2 and/or some other examples herein, wherein the third word line is the first word line and the third pass is the first pass, or the third word line is the second word line and the third pass is the second pass.

Example 4 may include the apparatus of example 1 and/or some other examples herein, wherein the multi-level NAND memory array is an n level NAND memory array, the multi-level NAND memory array includes multiple word lines that include the first word line and the second word line, and the memory controller is further to: receive, m pages of data that include the first page of data and the second page of data together with the program command to program the m pages of data into the n level NAND memory array; and program the m pages of data into pages of the multiple word lines, via multiple passes, wherein n>3, and n>=m>=2.

Example 5 may include the apparatus of any one of examples 1-4 and/or some other examples herein, wherein the first word line and the second word line are in a same block of the multi-level NAND memory array.

Example 6 may include the apparatus of any one of examples 1-4 and/or some other examples herein, wherein the first word line is in a first plane, a first die, or a first block of the multi-level NAND memory array, and the second word line is in a second plane, a second die, or a second block of the multi-level NAND memory array.

Example 7 may include the apparatus of any one of examples 1-4 and/or some other examples herein, wherein the memory controller is further to: report a cumulative pass or failure status for the program command to program the first page of data and the second page of data.

Example 8 may include the apparatus of any one of examples 1-4 and/or some other examples herein, wherein the multi-level NAND memory array is a three level NAND memory array, the first page of data is programmed into a lower page of the first word line, and the second page of data is programmed into an upper page or an extra page of the second word line.

Example 9 may include the apparatus of any one of examples 1-4 and/or some other examples herein, wherein the page of the first word line has a size in a range of about 8 kB to about 16 kB, and the page of the first word line is contained in a block of a size of about 4 MB to about 100 MB.

Example 10 may include the apparatus of any one of examples 1-4 and/or some other examples herein, wherein the apparatus is a storage device, and the program command is from an external computing device coupled to the storage device.

Example 11 may include the apparatus of any one of examples 1-4 and/or some other examples herein, wherein apparatus is a computing system, and the program command is from a processor of the computing system.

Example 12 may include an electronic system, comprising: a host controller, wherein the host controller is to generate a first page of data, a second page of data, and a program command to program the first page of data and the second page of data into a multi-level NAND memory array within a NAND memory system; and the NAND memory system coupled to the host controller, wherein the NAND memory system includes: the multi-level NAND memory array including a first word line and a second word line; and a memory controller coupled to the host controller and the multi-level NAND memory array, wherein the memory controller is to: receive the first page of data, the second page of data, together with the program command from the host controller; program the first page of data into a page of the first word line via a first pass; and program the second page of data into a page of the second word line via a second pass, subsequent to the first pass.

Example 13 may include the electronic system of example 12 and/or some other examples herein, wherein: the host controller is to generate a third page of data, and the program command is to program the first page of data, the second page of data, and the third page of data into the multi-level NAND memory array; and the multi-level NAND memory array is a three or higher level NAND memory array, the multi-level NAND memory array further includes a third word line, and the memory controller is further to: receive the third page of data together with the first page of data, the second page of data, and the program command from the host controller; and program the third page of data into a page of the third word line via a third pass.

Example 14 may include the electronic system of example 13 and/or some other examples herein, wherein the third word line is the first word line and the third pass is the first pass, or the third word line is the second word line and the third pass is the second pass.

Example 15 may include the electronic system of example 12 and/or some other examples herein, wherein: the host controller is to generate m pages of data that include the first page of data and the second page of data, and the program command is to program the m pages of data into the multi-level NAND memory array; the multi-level NAND memory array is an n level memory array, the multi-level NAND memory array includes multiple word lines that include the first word line and the second word line, and the memory controller is further to: receive the m pages of data together with the program command from the host controller; and program the m pages of data into pages of the multiple word lines, via multiple passes, wherein n>3, and n>=m>=2.

Example 16 may include the electronic system of any one of examples 12-15 and/or some other examples herein, wherein the first word line and the second word line are in a same block of the multi-level NAND memory array.

Example 17 may include the electronic system of any one of examples 12-15 and/or some other examples herein, wherein the first word line is in a first plane, a first die, or a first block of the multi-level NAND memory array, and the second word line is in a second plane, a second die, or a second block of the multi-level NAND memory array.

Example 18 may include one or more non-transitory computer-readable media comprising instructions that cause a memory controller, in response to execution of the instructions by the memory controller, to operate the memory controller to: receive a first page of data, a second page of data, together with a program command to program the first page of data and the second page of data into a multi-level NAND memory array coupled to the memory controller; program the first page of data into a page of a first word line of the multi-level NAND memory array via a first pass; and program the second page of data into a page of a second word line of the multi-level NAND memory array via a second pass subsequent to the first pass, wherein the multi-level NAND memory array includes the first word line and the second word line.

Example 19 may include the one or more non-transitory computer-readable media of example 18 and/or some other examples herein, wherein the memory controller is further caused to: receive a third page of data together with the first page of data, the second page of data, and the program command to program the first page of data, the second page of data, and the third page of data into the multi-level NAND memory array; and program the third page of data into a page of a third word line via a third pass, wherein the multi-level NAND memory array is a three or higher level memory array, and the multi-level NAND memory array further includes the third word line.

Example 20 may include the one or more non-transitory computer-readable media of example 19 and/or some other examples herein, wherein the third word line is the first word line and the third pass is the first pass, or the third word line is the second word line and the third pass is the second pass.

Example 21 may include the one or more non-transitory computer-readable media of example 18 and/or some other examples herein, wherein the memory controller is further caused to: receive m pages of data that includes the first page of data and the second page of data together with the program command the m pages of data into the multi-level NAND memory array; and program the m pages of data into pages of multiple word lines via multiple passes, wherein the multi-level NAND memory array is an n level memory array, the multi-level NAND memory array includes the multiple word lines that include the first word line and the second word line, n>3, and n>=m>=2.

Example 22 may include the one or more non-transitory computer-readable media of any one of examples 18-21 and/or some other examples herein, wherein the first word line and the second word line are in a same block of the multi-level NAND memory array.

Example 23 may include the one or more non-transitory computer-readable media of any one of examples 18-21 and/or some other examples herein, wherein the first word line is in a first plane, a first die, or a first block of the multi-level NAND memory array, and the second word line is in a second plane, a second die, or a second block of the multi-level NAND memory array.

Example 24 may include the one or more non-transitory computer-readable media of any one of examples 18-21 and/or some other examples herein, wherein the memory controller is within a storage device, and the program command is from an external computing device coupled to the storage device; or the memory controller is within a computing system, and the program command is from a processor of the computing system.

Example 25 may include the one or more non-transitory computer-readable media of any one of examples 18-21 and/or some other examples herein, wherein the multi-level NAND memory array is a three level NAND memory array, the first page of data is programmed into a lower page of the first word line, and the second page of data is programmed into an upper page or an extra page of the second word line.

Example 26 may include a method to operate a memory controller, comprising: receiving a first page of data, a second page of data, together with a program command to program the first page of data and the second page of data into a multi-level NAND memory array coupled to the memory controller; programming the first page of data into a page of a first word line of the multi-level NAND memory array via a first pass; and programming the second page of data into a page of a second word line of the multi-level NAND memory array via a second pass subsequent to the first pass, wherein the multi-level NAND memory array includes the first word line and the second word line.

Example 27 may include the method of example 26 and/or some other examples herein, further comprising: receiving a third page of data together with the first page of data, the second page of data, and the program command to program the first page of data, the second page of data, and the third page of data into the multi-level NAND memory array; and programming the third page of data into a page of a third word line via a third pass, wherein the multi-level NAND memory array is a three or higher level memory array, and the multi-level NAND memory array further includes the third word line.

Example 28 may include the method of example 27 and/or some other examples herein, wherein the third word line is the first word line and the third pass is the first pass, or the third word line is the second word line and the third pass is the second pass.

Example 29 may include the method of example 26 and/or some other examples herein, further comprising: receiving m pages of data that includes the first page of data and the second page of data together with the program command the m pages of data into the multi-level NAND memory array; and programming the m pages of data into pages of multiple word lines via multiple passes, wherein the multi-level NAND memory array is an n level memory array, the multi-level NAND memory array includes the multiple word lines that include the first word line and the second word line, n>3, and n>=m>=2.

Example 30 may include the method of any one of examples 26-29 and/or some other examples herein, wherein the first word line and the second word line are in a same block of the multi-level NAND memory array.

Example 31 may include the method of any one of examples 26-29 and/or some other examples herein, wherein the first word line is in a first plane, a first die, or a first block of the multi-level NAND memory array, and the second word line is in a second plane, a second die, or a second block of the multi-level NAND memory array.

Example 32 may include the method of any one of examples 26-29 and/or some other examples herein, wherein the memory controller is within a storage device, and the program command is from an external computing device coupled to the storage device; or the memory controller is within a computing system, and the program command is from a processor of the computing system.

Example 33 may include the method of any one of examples 26-29 and/or some other examples herein, wherein the multi-level NAND memory array is a three level NAND memory array, the first page of data is programmed into a lower page of the first word line, and the second page of data is programmed into an upper page or an extra page of the second word line.

Example 34 may include an apparatus for operating a memory controller, comprising: means for receiving a first page of data, a second page of data, together with a program command to program the first page of data and the second page of data into a multi-level NAND memory array coupled to the memory controller; means for programming the first page of data into a page of a first word line of the multi-level NAND memory array via a first pass; and means for programming the second page of data into a page of a second word line of the multi-level NAND memory array via a second pass subsequent to the first pass, wherein the multi-level NAND memory array includes the first word line and the second word line.

Example 35 may include the apparatus of example 34 and/or some other examples herein, further comprising: means for receiving a third page of data together with the first page of data, the second page of data, and the program command to program the first page of data, the second page of data, and the third page of data into the multi-level NAND memory array; and means for programming the third page of data into a page of a third word line via a third pass, wherein the multi-level NAND memory array is a three or higher level memory array, and the multi-level NAND memory array further includes the third word line.

Example 36 may include the apparatus of example 35 and/or some other examples herein, wherein the third word line is the first word line and the third pass is the first pass, or the third word line is the second word line and the third pass is the second pass.

Example 37 may include the apparatus of example 34 and/or some other examples herein, further comprising: means for receiving m pages of data that includes the first page of data and the second page of data together with the program command the m pages of data into the multi-level NAND memory array; and means for programming the m pages of data into pages of multiple word lines via multiple passes, wherein the multi-level NAND memory array is an n level memory array, the multi-level NAND memory array includes the multiple word lines that include the first word line and the second word line, n>3, and n>=m>=2.

Example 38 may include the apparatus of any one of examples 34-37 and/or some other examples herein, wherein the first word line and the second word line are in a same block of the multi-level NAND memory array.

Example 39 may include the apparatus of any one of examples 34-37 and/or some other examples herein, wherein the first word line is in a first plane, a first die, or a first block of the multi-level NAND memory array, and the second word line is in a second plane, a second die, or a second block of the multi-level NAND memory array.

Example 40 may include the apparatus of any one of examples 34-37 and/or some other examples herein, wherein the memory controller is within a storage device, and the program command is from an external computing device coupled to the storage device; or the memory controller is within a computing system, and the program command is from a processor of the computing system.

Example 41 may include the apparatus of any one of examples 34-37 and/or some other examples herein, wherein the multi-level NAND memory array is a three level NAND memory array, the first page of data is programmed into a lower page of the first word line, and the second page of data is programmed into an upper page or an extra page of the second word line.

Although certain embodiments have been illustrated and described herein for purposes of description this application is intended to cover any adaptations or variations of the embodiments discussed herein. Therefore, it is manifestly intended that embodiments described herein be limited only by the claims.

What is claimed is:

1. An apparatus for computing, comprising:
   a multi-level NAND memory array including a first word line and a second word line;
   a memory controller coupled to the multi-level NAND memory array, wherein the memory controller is to:
   receive a first page of data and a second page of data together with a program command from a host controller to program the first page of data and the second page of data into the multi-level NAND memory array, wherein the first page of data, the second page of data, and the program command are programmed by the host controller in a single pass at a same time;
   program the first page of data into a page of the first word line via a first pass in the NAND memory array; and
   program the second page of data into a page of the second word line via a second pass in the NAND memory array, subsequent to the first pass.

2. The apparatus of claim 1, wherein the multi-level NAND memory array is a three or higher level NAND memory array, the multi-level NAND memory array further includes a third word line, and the memory controller is further to:
   receive, a third page of data together with the first page of data, the second page of data, and the program command to program the first page of data, the second page of data, and the third page of data into the multi-level NAND memory array; and
   program the third page of data into a page of the third word line via a third pass.

3. The apparatus of claim 2, wherein the third word line is the first word line and the third pass is the first pass, or the third word line is the second word line and the third pass is the second pass.

4. The apparatus of claim 1, wherein the multi-level NAND memory array is an n level NAND memory array, the multi-level NAND memory array includes multiple word lines that include the first word line and the second word line, and the memory controller is further to:
   receive m pages of data that include the first page of data and the second page of data together with the program command to program the m pages of data into the n level NAND memory array; and
   program the m pages of data into pages of the multiple word lines, via multiple passes, wherein n>3, and n>=m>=2.

5. The apparatus of claim 1, wherein the first word line and the second word line are in a same block of the multi-level NAND memory array.

6. The apparatus of claim 1, wherein the first word line is in a first plane, a first die, or a first block of the multi-level NAND memory array, and the second word line is in a second plane, a second die, or a second block of the multi-level NAND memory array.

7. The apparatus of claim 1, wherein the memory controller is further to:
   report a cumulative pass or failure status for the program command to program the first page of data and the second page of data.

8. The apparatus of claim 1, wherein the multi-level NAND memory array is a three level NAND memory array, the first page of data is programmed into a lower page of the first word line, and the second page of data is programmed into an upper page or an extra page of the second word line.

9. The apparatus of claim 1, wherein the page of the first word line has a size in a range of about 8 kB to about 16 kB, and the page of the first word line is contained in a block of a size of about 4 MB to about 100 MB.

10. The apparatus of claim 1, wherein the apparatus is a storage device, and the program command is from an external computing device coupled to the storage device.

11. The apparatus of claim 1, wherein apparatus is a computing system, and the program command is from a processor of the computing system.

12. An electronic system, comprising:
   a host controller, wherein the host controller is to generate a first page of data, a second page of data, and a program command to program the first page of data and the second page of data into a multi-level NAND memory array within a NAND memory system; and
   the NAND memory system coupled to the host controller, wherein the NAND memory system includes:
   the multi-level NAND memory array including a first word line and a second word line; and
   a memory controller coupled to the host controller and the multi-level NAND memory array, wherein the memory controller is to:
   receive the first page of data, the second page of data, together with the program command from the host controller in a single pass at a same time;

program the first page of data into a page of the first word line via a first pass in the NAND memory array; and program the second page of data into a page of the second word line via a second pass in the NAND memory array, subsequent to the first pass.

13. The electronic system of claim 12, wherein:

the host controller is to generate a third page of data, and the program command is to program the first page of data, the second page of data, and the third page of data into the multi-level NAND memory array; and the multi-level NAND memory array is a three or higher level NAND memory array, the multi-level NAND memory array further includes a third word line, and the memory controller is further to:

receive the third page of data together with the first page of data, the second page of data, and the program command from the host controller; and program the third page of data into a page of the third word line via a third pass.

14. The electronic system of claim 13, wherein the third word line is the first word line and the third pass is the first pass, or the third word line is the second word line and the third pass is the second pass.

15. The electronic system of claim 12, wherein:

the host controller is to generate m pages of data that include the first page of data and the second page of data, and the program command is to program the m pages of data into the multi-level NAND memory array;

the multi-level NAND memory array is an n level memory array, the multi-level NAND memory array includes multiple word lines that include the first word line and the second word line, and the memory controller is further to:

receive the m pages of data together with the program command from the host controller; and program them pages of data into pages of the multiple word lines, via multiple passes, wherein n>3, and n>=m>=2.

16. The electronic system of claim 12, wherein the first word line and the second word line are in a same block of the multi-level NAND memory array.

17. The electronic system of claim 12, wherein the first word line is in a first plane, a first die, or a first block of the multi-level NAND memory array, and the second word line is in a second plane, a second die, or a second block of the multi-level NAND memory array.

18. One or more non-transitory computer-readable media comprising instructions that cause a memory controller, in response to execution of the instructions by the memory controller, to operate the memory controller to:

receive a first page of data, a second page of data, together with a program command from a host controller to program the first page of data and the second page of data into a multi-level NAND memory array coupled to the memory controller, wherein the first page of data, the second page of data, and the program command are programmed by the host controller in a single pass at a same time;

program the first page of data into a page of a first word line of the multi-level NAND memory array via a first pass in the NAND memory array; and program the second page of data into a page of a second word line of the multi-level NAND memory array via a second pass in the NAND memory array subsequent to the first pass, wherein the multi-level NAND memory array includes the first word line and the second word line.

19. The one or more non-transitory computer-readable media of claim 18, wherein the memory controller is further caused to:

receive a third page of data together with the first page of data, the second page of data, and the program command to program the first page of data, the second page of data, and the third page of data into the multi-level NAND memory array; and program the third page of data into a page of a third word line via a third pass, wherein the multi-level NAND memory array is a three or higher level memory array, and the multi-level NAND memory array further includes the third word line.

20. The one or more non-transitory computer-readable media of claim 19, wherein the third word line is the first word line and the third pass is the first pass, or the third word line is the second word line and the third pass is the second pass.

21. The one or more non-transitory computer-readable media of claim 18, wherein the memory controller is further caused to:

receive m pages of data that includes the first page of data and the second page of data; wherein the program command is to program the m pages of data into the multi-level NAND memory array; and program the m pages of data into pages of multiple word lines via multiple passes, wherein the multi-level NAND memory array is an n level memory array, the multi-level NAND memory array includes the multiple word lines that include the first word line and the second word line, n>3, and n>=m>=2.

22. The one or more non-transitory computer-readable media of claim 18, wherein the first word line and the second word line are in a same block of the multi-level NAND memory array.

23. The one or more non-transitory computer-readable media of claim 18, wherein the first word line is in a first plane, a first die, or a first block of the multi-level NAND memory array, and the second word line is in a second plane, a second die, or a second block of the multi-level NAND memory array.

24. The one or more non-transitory computer-readable media of claim 18, wherein the memory controller is within a storage device, and the program command is from an external computing device coupled to the storage device; or the memory controller is within a computing system, and the program command is from a processor of the computing system.

25. The one or more non-transitory computer-readable media of claim 18, wherein the multi-level NAND memory array is a three level NAND memory array, the first page of data is programmed into a lower page of the first word line, and the second page of data is programmed into an upper page or an extra page of the second word line.

* * * * *

UNITED STATES PATENT AND TRADEMARK OFFICE
CERTIFICATE OF CORRECTION

PATENT NO. : 10,446,238 B2  
APPLICATION NO. : 15/717835  
DATED : October 15, 2019  
INVENTOR(S) : Aliasgar S. Madraswala Page 1 of 1

It is certified that error appears in the above-identified patent and that said Letters Patent is hereby corrected as shown below:

In the Claims

Column 20  
Line 1, "...receive, a third page..." should read "...receive a third page..."  
Line 49, "...wherein apparatus..." should read "...wherein the apparatus..."

Column 21  
Line 38, "...them pages..." should read "...the m pages..."

Signed and Sealed this  
Twenty-eighth Day of January, 2020

Andrei Iancu  
*Director of the United States Patent and Trademark Office*